(12) United States Patent
Tamura et al.

(10) Patent No.: US 6,203,966 B1
(45) Date of Patent: Mar. 20, 2001

(54) STEREOLITHOGRAPHIC RESIN COMPOSITION

(75) Inventors: Yorikazu Tamura; Tsuneo Hagiwara, both of Kawasaki (JP)

(73) Assignee: Teijin Seiki Co., Ltd., Osaka (JP)

( * ) Notice: Subject to any disclaimer, the term of this patent is extended or adjusted under 35 U.S.C. 154(b) by 0 days.

(21) Appl. No.: 09/155,783

(22) PCT Filed: Jan. 29, 1998

(86) PCT No.: PCT/JP98/00367

§ 371 Date: Oct. 2, 1998

§ 102(e) Date: Oct. 2, 1998

(87) PCT Pub. No.: WO98/34987

PCT Pub. Date: Aug. 13, 1998

(30) Foreign Application Priority Data

Feb. 5, 1997 (JP) .................................................. 9-035690

(51) Int. Cl.$^7$ ...................................................... G03F 7/027
(52) U.S. Cl. ................................... 430/284.1; 430/285.1; 430/280.1; 430/269; 522/83; 264/401
(58) Field of Search ...................... 522/83; 430/284.1, 430/285.1, 280.1, 269; 264/401

(56) References Cited

U.S. PATENT DOCUMENTS

| | | | |
|---|---|---|---|
| 4,942,066 | 7/1990 | Fan et al. | 427/54.1 |
| 5,002,854 | 3/1991 | Fan et al. | 430/269 |
| 5,002,855 | 3/1991 | Fan et al. | 430/270 |
| 5,014,207 | 5/1991 | Lawton | 364/468 |
| 5,591,563 | 1/1997 | Suzuki et al. | 430/284.1 |
| 5,679,722 | 10/1997 | Tamura | 522/96 |
| 5,731,388 | * 3/1998 | Suzuki et al. | 525/404 |

FOREIGN PATENT DOCUMENTS

| | | | |
|---|---|---|---|
| 0802455 A1 | 10/1997 | (EP) | G03F/7/027 |
| 56-144478 | 11/1981 | (JP) | G09B/25/06 |
| 60-247515 | 12/1985 | (JP) | B29C/39/22 |
| 62-35966 | 2/1987 | (JP) | G06F/15/60 |
| 1-204915 | 8/1989 | (JP) | C08F/299/00 |
| 1-213304 | 8/1989 | (JP) | C08F/2/48 |
| 2-28261 | 1/1990 | (JP) | C08L/101/00 |
| 2-75617 | 3/1990 | (JP) | C08G/59/00 |
| 2-113925 | 4/1990 | (JP) | B29C/67/00 |
| 2-145616 | 6/1990 | (JP) | C08F/299/00 |
| 2-153722 | 6/1990 | (JP) | B29C/67/00 |
| 3-41126 | 2/1991 | (JP) | B29C/67/00 |
| 3-104626 | 5/1991 | (JP) | B29C/67/00 |
| 06128342 | 5/1994 | (JP) | C08F/299/02 |
| 07026062 | 1/1995 | (JP) | C08K/9/06 |
| 08323866 | 12/1996 | (JP) | B29C/67/00 |

OTHER PUBLICATIONS

Parker, Sybil, et al, eds, *McGraw–Hill Dictionary of Chemical Terms*, McGraw–Hill Book Company, New York, NY, 1985, pp. 18–19.*

* cited by examiner

Primary Examiner—Cynthia Hamilton
(74) Attorney, Agent, or Firm—Anderson, Kill & Olick P.C.

(57) ABSTRACT

A resin composition for forming a three-dimensional object by optical stereolithography, which contains 5 to 65 vol % of aluminum oxide fine particles having an average particle diameter of 3 to 70 μm and 5 to 30 vol % of whiskers having a diameter of 0.3 to 1 μm, a length of 10 to 70 μm and an aspect ratio of 10 to 100, the total content of the aluminum oxide fine particles and the whiskers being 10 to 70 vol %.

According to the resin composition for forming a three-dimensional object by optical stereolithography, a high-quality three-dimensional object by optical stereolithography that has high heat resistance with a high heat distortion temperature and high rigidity with a high flexural modulus and that is free from a dimensional change on account of a low linear thermal expansion coefficient even when temperature varies can be obtained by optical stereolithography with high dimensional accuracy.

7 Claims, No Drawings

STEREOLITHOGRAPHIC RESIN COMPOSITION

TECHNICAL FIELD

The present invention relates to a resin composition for forming a three-dimensional object by optical stereolithography, a method for producing a three-dimensional object from the resin composition by optical stereolithography and a three-dimensional object obtained using the resin composition by optical stereolithography. More specifically, it relates to a resin composition for forming a three-dimensional object by optical stereolithography, which can provide a three-dimensional object by optical stereolithography having high heat resistance with an extremely high heat deformation temperature and high rigidity with an extremely high flexural modulus, both properties of which could not be attained by the prior art, excellent dimensional accuracy with a small volume shrinkage factor at the time of photo-curing, and heat dimensional stability matching that of filler-reinforced super engineering plastics on account of an extremely low linear thermal expansion coefficient; to a method for producing a three-dimensional object from the resin composition by optical stereolithography; and to a three-dimensional object by optical stereolithography obtained using the method.

BACKGROUND ART

In general, a liquid photo-curable resin composition is widely used as a coating agent (especially a hard coating agent), photoresist or dental material. In recent years, special attention has been paid to a method for producing a three-dimensional object from the photo-curable resin composition by optical stereolithography based on data input into 3-D CAD. As for optical stereolithography technology, JP-A 56-144478 discloses an optical stereolithography for producing a three-dimensional object, which comprises repeating the steps of supplying a liquid photo-curable resin with a required amount of controlled light energy to cure the resin in the form of a thin layer, further supplying a liquid photo-curable resin on the top of the cured layer, and exposing the resin to light under control to cure it into a thin layer to be laminated on the cured layer; and its fundamental practical application method is proposed in JP-A 60-247515. Since then, a large number of proposals on optical stereolithography have been made. Furthermore, JP-A 62-35966, JP-A 1-204915, JP-A 2-113925, JP-A 2-145616, JP-A 2-153722, JP-A 3-15520, JP-A 3-21432 and JP-A 3-41126 disclose techniques for optical stereolithography.

As a typical method for optically producing a three-dimensional object, a method is generally and widely employed that comprises selectively irradiating a liquid surface of a liquid photo-curable resin composition contained in a container with ultraviolet laser light under the control by a computer to cure it to a predetermined thickness so that a desired pattern can be obtained, then supplying a liquid resin composition in an amount enough to form one layer onto the cured layer, irradiating it with ultraviolet laser light likewise to cure it so as to form a cured layer to be laminated continuously, and repeating this lamination steps to obtain a three-dimensional object having a final shape. Since this method makes it possible to produce a three-dimensional object having a very complex shape with ease and in a relatively short period of time, it has recently been attracting much attention.

As the photo-curable resin composition used as a coating agent, photoresist or dental material, there are used those obtained by adding a photopolymerization initiator to a curable resin such as an unsaturated polyester, epoxy (meth) acrylate, urethane (meth)acrylate or (meth)acrylate monomer.

The photo-curable resin composition to be used in optical stereolithography is a composition comprising at least one photopolymerizable compound such as a photopolymerizable modified (poly)urethane (meth)acrylate compound, oligoester acrylate compound, epoxy acrylate compound, epoxy compound, polyimide compound, aminoalkyd compound or vinyl ether compound as an essential ingredient and a photopolymerization initiator. JP-A 1-204915, JP-A 1-213304, JP-A 2-28261, JP-A 2-75617, JP-A 2-145616, JP-A 3-104626, JP-A 3-114732 and JP-A 3-114733 disclose improved arts therefor.

The photo-curable resin composition to be used in optical stereolithography must be a low-viscosity liquid and have small volume shrinkage at the time of curing from the viewpoint of handling properties, shaping speed and shaping accuracy and it must be able to give a three-dimensional object having excellent mechanical properties when photo-cured. Along with the increased demand and expanded application of three-dimensional objects formed by optical stereolithography in recent years, three-dimensional objects have been demanded to have excellent heat resistance with a high heat distortion temperature, high rigidity, and excellent heat dimensional stability with a small thermal expansion coefficient and a small dimensional change regardless of temperature change, in addition to the above properties. For example, three-dimensional objects by optical stereolithography that are used in the design of a complex heating medium circuit or for the analysis of the behavior of a heating medium having a complex structure are required to have small volume shrinkage at the time of photo-curing, a high heat distortion temperature, and rigidity and heat dimensional stability.

Therefore, for obtaining a three-dimensional object having improved heat resistance by optical stereolithography, there have been studied a method in which a benzene ring is introduced into the molecule of a photo-curable resin, a method in which the cross-linking density of a photo-curable material is increased, and the like. Even in these methods, the heat distortion temperature measured under high load is around 70 to 80° C. at the best and the heat resistance is not sufficient.

Furthermore, when the heat resistance of an photo-cured product is to be improved, the volume shrinkage at the time of curing becomes large with the result of a reduction in dimensional accuracy. Therefore, a photo-curable resin composition has not yet been obtained that has both improved heat resistance and reduced volume shrinkage at the time of curing.

In general, the heat resistance is expected to be improved when the cross-linking density of a photo-curable resin composition is increased. An increase in cross-linking density, however, induces a growth in volume shrinkage at the time of curing. That is, the improvement of heat resistance and the reduction of volume shrinkage at the time of curing conflict with each other. Therefore, there has been desired a three-dimensional object by optical stereolithography having excellent heat resistance and small volume shrinkage at the time of curing, breaking through such conflicting relationship between them.

A conventional three-dimensional object formed by optical stereolithography generally has a linear thermal expansion coefficient of $4 \times 10^{-5}$ cm/cm/° C. or more, and a three-dimensional object by optical stereolithography having a small thermal expansion coefficient, for example, a linear thermal expansion coefficient of $3\times10^{-5}$ cm/cm/° C. or less, like that of filler reinforced super engineering plastics (a glass fiber reinforced polyamide-imide resin or the like, for example) has not been obtained yet. Therefore, in consideration of the above situation, a three-dimensional object by optical stereolithography has been desired that has a low thermal expansion coefficient and a small dimensional change even at change of temperature.

Then, the present inventors have found and proposed in Japanese Patent No. 2554443 and JP-A 8-20620 that a three-dimensional object by optical stereolithography having excellent dimensional accuracy with small volume shrinkage at the time of curing, excellent mechanical properties, and excellent heat resistance with a high heat distortion temperature can be obtained when a liquid photo-curable resin composition is blended with a specific filler and the blend is subjected to optical stereolithography.

DISCLOSURE OF THE INVENTION

The present inventors have conducted further studies and found that a three-dimensional object by optical stereolithography having a higher heat distortion temperature and a higher flexural modulus than that of the above invention previously proposed by the present inventors can be obtained when a resin composition for forming a three-dimensional object by optical stereolithography, which comprises, as fillers, aluminum oxide fine particles having a predetermined particle diameter and whiskers having a specific size in a specific ratio, is subjected to optical stereolithography. The present invention has been accomplished based on this finding.

It is therefore an object of the present invention to provide a novel resin composition for forming a three-dimensional object by optical stereolithography.

It is another object of the present invention to provide a novel resin composition for forming a three-dimensional object by optical stereolithography, which has an extremely high heat distortion temperature of 300° C. or higher, an extremely high flexural modulus of 2,000 kg/mm$^2$ or more, and high heat resistance and rigidity which could not be attained by the prior art.

It is still another object of the present invention to provide a resin composition for forming a three-dimensional object by optical stereolithography, which can provide a three-dimensional object of great commodity value that has excellent heat dimensional stability with an extremely small thermal expansion coefficient of $3\times10^{-5}$ cm/cm/° C. or less.

It is still another object of the present invention to provide a method for producing a three-dimensional object from the resin composition of the present invention by optical stereolithography.

It is still another object of the present invention to provide a three-dimensional object produced from the resin composition for forming a three-dimensional object by optical stereolithography, of the present invention.

Other objects and advantages of the present invention will become apparent from the following description.

According to the present invention, the above objects and advantages of the present invention, firstly, can be attained by a resin composition for forming a three-dimensional object by optical stereolithography, which contains, in a liquid photo-curable resin, 5 to 65 vol % of aluminum oxide fine particles having an average particle diameter of 3 to 70 µm and 5 to 30 vol % of whiskers having a diameter of 0.3 to 1 µm, a length of 10 to 70 µm and an aspect ratio of 10 to 100, based on the total volume of the resin composition, with the total content of the aluminum oxide fine particles and the whiskers being 10 to 70 vol % based on the total volume of the resin composition for forming a three-dimensional object by optical stereolithography.

Secondly, the above objects and advantages of the present invention can be attained by a method for producing a three-dimensional object from the above resin composition by optical stereolithography.

Thirdly, the above objects and advantages of the present invention can be attained by a three-dimensional object obtained using the resin composition of the present invention for forming a three-dimensional object by optical stereolithography. This three-dimensional object by optical stereolithography particularly preferably includes a three-dimensional object by optical stereolithography having a heat distortion temperature, measured under a high load of 18.5 kg/mm$^2$, of 300° C. or higher and a flexural modulus of 2,000 kg/mm$^2$ or more, and a three-dimensional object by optical stereolithography having a linear thermal expansion coefficient of $0.5\times10^{-5}$ to $3\times10^{-5}$ cm/cm/° C.

BEST MODE FOR PRACTICING THE INVENTION

The present invention will be described in detail below.

The resin composition of the present invention for forming a three-dimensional object by optical stereolithography that can form a three-dimensional object by optical stereolithography having small volume shrinkage at the time of curing, a high heat distortion temperature, a high flexural modulus, and a low linear thermal expansion coefficient contains aluminum oxide fine particles having a specific particle diameter and whiskers having a specific size, as described above.

The aluminum oxide fine particles used in the present invention must have an average particle diameter of 3 to 70 µm.

When the average particle diameter of the aluminum oxide fine particles is smaller than 3 µm, the viscosity of the resin composition for forming a three-dimensional object by optical stereolithography becomes high, thereby making it difficult to blend a predetermined amount of aluminum oxide fine particles required to provide a high heat distortion temperature and a high flexural modulus to a three-dimensional object by optical stereolithography and besides, deteriorating handling properties at the time of forming a three-dimensional object by optical stereolithography.

On the other hand, when the average particle diameter of the aluminum oxide fine particles is larger than 70 µm, the viscosity of the resin composition does not increase so much, but the diffusion of irradiation energy of, for example, ultraviolet light occurs at the time of forming a three-dimensional object by optical stereolithography, thereby deteriorating shaping accuracy, and also the thickness of each layer is restricted when a three-dimensional object is formed by optical stereolithography, thereby deteriorating shaping accuracy.

From the viewpoint of the handling and shaping properties of the resin composition for forming a three-dimensional object by optical stereolithography and the dimensional accuracy of the obtained three-dimensional object by optical stereolithography, the average particle diameter of the aluminum oxide fine particles is preferably 10 to 60 µm, more preferably 15 to 50 µm.

The "average particle diameter of the aluminum oxide fine particles" as used herein means the average particle diameter of aluminum oxide fine particles obtained by measurement through a scanning electron microscope, and its details are given in the section of Examples.

The aluminum oxide fine particle used in the present invention may be either transparent or opaque. The shape of the aluminum oxide fine particle is preferably as spherical as possible because having such a shape not only reduces the irregular reflection of irradiation energy at the time of forming a three-dimensional object by optical stereolithography so that a three-dimensional object by optical stereolithography having high dimensional accuracy can be obtained, but also does not increase the viscosity of the resin composition for forming a three-dimensional object by optical stereolithography so that a resin composition for forming a three-dimensional object by optical stereolithography having excellent handling and shaping properties for forming a three-dimensional object by optical stereolithography can be obtained.

Aluminum oxide fine particles having a spherical shape with a relative standard deviation, represented by the following expression (1), of 5 or less or a similar shape are particularly preferred in view of both the prevention of an increase in the viscosity of the resin composition for forming a three-dimensional object by optical stereolithography and the dimensional accuracy of the obtained three-dimensional object by optical stereolithography. The relative standard deviation is more preferably 1 or less, much more preferably 0.5 or less.

$$\text{relative standard deviation of sphericity} = \sqrt{\left(\sum_{i}^{n} \frac{(D_i - D)^2}{n}\right)} / D \quad (1)$$

wherein $D_i$: area circle equivalent diameter ($\mu$m) of each particle $D$: average value of area circle equivalent diameters $$\left(\sum_{i}^{n} D_i / n\right)(\mu m)$$

$n$: number of particles

The whiskers used in the resin composition for forming a three-dimensional object by optical stereolithography of the present invention must have a diameter of 0.3 to 1 $\mu$m, a length of 10 to 70 $\mu$m and an aspect ratio of 10 to 100, preferably a diameter of 0.3 to 0.7 $\mu$m, a length of 20 to 50 $\mu$m and an aspect ratio of 20 to 70.

When the diameter of the whiskers is smaller than 0.3 $\mu$m, the heat distortion temperature, flexural modulus and mechanical properties of the obtained three-dimensional object by optical stereolithography lower, while when the diameter Is larger than 1 $\mu$m, the viscosity of the resin composition for forming a three-dimensional object by optical stereolithography increases, thereby deteriorating handling and shaping properties. When the length of the whiskers is smaller than 10 $\mu$m, the heat distortion temperature, flexural modulus and mechanical properties lower, while when the length is larger than 70 $\mu$m, the viscosity of the resin composition for forming a three-dimensional object by optical stereolithography increases, thereby deteriorating handling and shaping properties.

It is particularly important that the aspect ratio of the whiskers is in the above range of 10 to 100. When the aspect ratio is smaller than 10, the effects of improving mechanical properties and reducing volume shrinkage at the time of forming a three-dimensional object by optical stereolithography cannot be obtained. On the other hand, when the aspect ratio is larger than 100, the viscosity of the resin composition for forming a three-dimensional object by optical stereolithography increases, thereby making the operation of shaping difficult and reducing the accuracy of the side of the three-dimensional object by optical stereolithography.

The "size and aspect ratio of the whiskers" as used herein are measured using a laser diffraction/diffusion type particle size distribution measuring instrument, and their details are given in the section of Examples.

Although the kind of the whiskers is not particularly limited, aluminum-based whiskers are preferred not only because they have a high affinity for aluminum fine particles but also because a three-dimensional object by optical stereolithography having a high heat distortion temperature, flexural modulus and mechanical strength can be obtained. Such aluminum-based whiskers are, for example, aluminum borate whiskers, aluminum oxide whiskers or aluminum nitride whiskers. These aluminum whiskers can be used alone or in combination of two or more.

The resin composition for forming a three-dimensional object by optical stereolithography of the present invention must contain 5 to 65 vol % of the above aluminum oxide fine particles and 5 to 30 vol % of the above whiskers based on the total volume of the resin composition for forming a three-dimensional object by optical stereolithography. In addition, the total content of the aluminum oxide fine particles and the whiskers must be 10 to 70 vol % based on the total volume of the resin composition for forming a three-dimensional object by optical stereolithography.

When the content of the aluminum oxide fine particles is smaller than 5 vol % based on the total volume of the resin composition for forming a three-dimensional object by optical stereolithography, the effects of improving heat distortion temperature and flexural modulus and reducing linear thermal expansion coefficient which are obtained by blending the aluminum oxide fine particles are not exhibited. When the content is larger than 65 vol %, the viscosity of the resin composition for forming a three-dimensional object by optical stereolithography increases, thereby making it difficult to form a three-dimensional object by optical stereolithography and greatly restricting the average particle diameter of the aluminum oxide fine particles.

When the content of the whiskers is smaller than 5 vol % based on the total volume of the resin composition for forming a three-dimensional object by optical stereolithography, the effects of improving heat distortion temperature and flexural modulus and reducing linear thermal expansion coefficient and mechanical strength which are obtained by blending the whiskers are not exhibited and the mechanical strength of the three-dimensional object by optical stereolithography lowers. On the other hand, when the content is larger than 30 vol %, the viscosity of the resin composition for forming a three-dimensional object by optical stereolithography increases, thereby making it difficult to form a three-dimensional object by optical stereolithography and reducing the dimensional accuracy of the three-dimensional object by optical stereolithography.

When the total content of the aluminum oxide fine particles and the whiskers is smaller than 10 vol % based on the total volume of the resin composition for forming a three-dimensional object by optical stereolithography, the volume shrinkage at the time of forming a three-dimensional object by optical stereolithography becomes large, whereby the dimensional accuracy of the obtained three-dimensional object by optical stereolithography deteriorates, the heat distortion temperature, flexural modulus and mechanical strength of the three-dimensional object by optical stereolithography lower, and a thermal expansion coefficient cannot be reduced. On the other hand, when the total content is larger than 70 vol %, the viscosity of the resin composition for forming a three-dimensional object by optical stereolithography increases, thereby deteriorating handling and shaping properties and reducing the dimensional accuracy of the obtained three-dimensional object by optical stereolithography.

In the resin composition of the present invention, it is preferred that the content of the above aluminum oxide fine particles be 10 to 55 vol %, the content of the above whiskers be 5 to 25 vol % and the total content of the aluminum oxide fine particles and the whiskers be 20 to 60 vol % based on the total volume of the resin composition for forming a three-dimensional object by optical stereolithography because the viscosity, handling and shaping properties of the resin composition for forming a three-dimensional object by optical stereolithography are improved, the dimensional accuracy of the three-dimensional object by optical stereolithography obtained with small volume shrinkage at the time of forming a three-dimensional object by optical stereolithography is also improved, the heat distortion temperature, flexural modulus and mechanical strength of the obtained three-dimensional object by optical stereolithography become much higher, and the linear thermal expansion coefficient thereof becomes much smaller.

Particularly, to smoothly obtain a three-dimensional object by optical stereolithography having not only excellent characteristic properties such as a high heat distortion temperature, a high flexural modulus, high mechanical properties and a low volume shrinkage factor but also a low linear thermal expansion coefficient of $0.5 \times 10^{-5}$ to $3 \times 10^{-5}$ cm/cm/° C., it is desired to adjust the content of the above aluminum oxide fine particles in the resin composition for forming a three-dimensional object by optical stereolithography of the present invention to 15 to 55 vol %, the content of the above whiskers to 5 to 20 vol %, and the total content of the aluminum oxide fine particles and the whiskers to 20 to 60 vol %. Particularly when the content of the aluminum oxide fine particles is adjusted to 20 to 50 vol %, the content of the whiskers to 10 to 20 vol % and the total content of the aluminum oxide fine particles and the whiskers to 30 to 60 vol % based on the total volume of the resin composition for forming a three-dimensional object by optical stereolithography, a three-dimensional object by optical stereolithography having excellent heat dimensional stability with a linear thermal expansion coefficient of $2 \times 10^{-5}$ cm/cm/° C. or less can be obtained smoothly.

In the present invention, either or both of the aluminum oxide fine particles and the whiskers may be surface-treated with a silane coupling agent. It is preferred that both are surface-treated with a silane coupling agent. When the aluminum oxide fine particles and/or the whiskers are surface-treated with a silane coupling agent, a three-dimensional object by optical stereolithography having a higher heat distortion temperature, flexural modulus and mechanical strength can be obtained.

Any silane coupling agent which has been hitherto used for the surface treatment of a filler is usable as the silane coupling agent. The silane coupling agent is preferably an aminosilane, epoxysilane, vinylsilane or (meth)acrylsilane.

Illustrative examples of the silane coupling agent include aminosilanes such as γ-aminopropyltriethoxysilane, N-β- (aminoethyl)-γ-aminopropyltriethoxysilane and N-β-(aminoethyl)-γ-aminopropylmethyldimethoxysilane; epoxysilanes such as β-(3,4-epoxycyclohexyl)-ethyltrimethoxysilane and γ-glycidoxypropyltrimethoxysilane; vinylsilanes such as vinyltrichlorosilane, vinyldiethoxysilane and vinyl-tris(β-methoxyethoxysilane); and (meth)acrylsilanes such as trimethoxysilane methacrylate. These silane coupling agents may be used alone or in combination of two or more.

When aluminum oxide fine particles and/or whiskers are surface-treated with a silane coupling agent, it is preferred to select a silane coupling agent suitable for each photo-curable resin and carry out the surface treatment of aluminum oxide fine particles and/or whiskers because the silane coupling agent may function differently according to the kind of a photo-curable resin used.

For example, a vinylsilane and/or (meth)acrylsilane are/is preferably used for a photo-curable resin composed essentially of a vinyl-based unsaturated compound, and an epoxysilane is preferably used for a photo-curable resin composed essentially of an epoxy-based compound.

In the present invention, any liquid photo-curable resin for forming a three-dimensional object by optical stereolithography which comprises a photopolymerizable compound and a photopolymerization initiator is acceptable as the liquid photo-curable resin. The liquid photo-curable resin usable in the present invention, though not particularly limited, is, for example, an acrylate-based photo-curable resin, urethane acrylate-based photo-curable resin, epoxy-based photo-curable resin, epoxy acrylate-based photo-curable resin, vinyl ether-based photo-curable resin or the like. In this case, the liquid photo-curable resin of the present invention may contain one or more of the above liquid photo-curable resins. The kind of a photopolymerization initiator may also differ depending on the type of a liquid photo-curable resin contained in the liquid photo-curable resin, as exemplified by a photo-radical polymerization initiator, a photo-cationic polymerization initiator and a combination of a photo-radical polymerization initiator and a photo-cationic polymerization initiator.

Illustrative examples of the liquid photo-curable resin usable in the present invention, though not particularly limited, include:

(1) radical-polymerizable liquid acrylate-based photo-curable resins comprising a monofunctional or polyfunctional polyester (meth)acrylate or polyether meth)acrylate as a main ingredient, a monofunctional meth)acrylate monomer or polyfunctional (meth)acrylate monomer as required, and a photo-radical polymerization initiator.

(2) liquid epoxy acrylate-based photo-curable resins comprising a monofunctional or polyfunctional epoxy (meth)acrylate as a main ingredient, a monofunctional (meth)acrylate monomer or polyfunctional (meth)acrylate monomer as required, a photo-radical polymerization initiator, and a photo-cationic polymerization initiator as required.

(3) radical-polymerizable liquid urethane acrylate-based photo-curable resins comprising a monofunctional or polyfunctional urethane (meth)acrylate as a main ingredient, a monofunctional (meth)acrylate monomer or polyfunctional (meth)acrylate monomer as required, and a photo-radical polymerization initiator.

(4) liquid epoxy-based photo-curable resins comprising at least one selected from the group consisting of aliphatic diepoxy compounds, alicyclic diepoxy compounds and aromatic diepoxy compounds as a main ingredient, a monofunctional (meth)acrylate monomer or polyfunctional (meth)acrylate monomer as required, a photo-cationic polymerization initiator, and a photo-radical polymerization initiator as required.

(5) liquid vinyl ether-based photo-curable resins comprising an aliphatic divinyl ether compound, alicyclic divinyl ether compound or aromatic divinyl ether compound as a main ingredient and an photo-radical polymerization initiator.

(6) mixed liquid photo-curable resins comprising at least two members selected from the group consisting of acrylate-based compounds, urethane acrylate-based compounds and epoxy acrylate-based compounds, a photo-radical polymerization initiator, and a photo-cationic polymerization initiator as required.

A three-dimensional object by optical stereolithography having excellent dimensional accuracy with small volume shrinkage at the time of curing, excellent heat resistance and rigidity with a high heat distortion temperature and flexural modulus, and high mechanical strength can be obtained by blending any of the above liquid photo-curable resins (1) to (6) with the above aluminum oxide fine particles and the whiskers in the above ratios to prepare the resin composition for forming a three-dimensional object by optical stereolithography of the present invention and subjecting the resulting resin composition to optical stereolithography.

Of the above liquid photo-curable resin compositions, the preferred is a liquid photo-curable resin which the present inventors have developed and which comprises:

(i) at least one urethanated acryl compound (to be referred to as "urethanated acryl compound (I)" hereinafter) represented by the following formula (I):

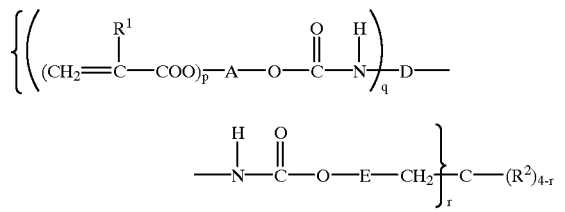

(I)

wherein $R^1$ is a hydrogen atom or a methyl group, p is 1 or 2 provided that either or both of $R^1$'s is/are a methyl group when p is 2, A is a residual group of diol or triol, D is a divalent or trivalent nonsubstituted or substituted hydrocarbon group, E is a (poly)ethylene oxide group represented by the formula: —$(CH_2CH_2O)_s$— (in which s is an integer of 1 to 4), a (poly)propylene oxide group represented by the formula —$[(CH_2CH(CH_3)O]_t$— (in which t is an integer of 1 to 4) or a (poly)ethylene oxide propylene oxide group represented by the formula —$(CH_2CH_2O)_u[(CH_2CH(CH_3)O]_v$— (in which u and v are each an integer of 1 to 3 and the sum of u and v is 2 to 4), $R^2$ is a hydrogen atom or an alkyl group, q is 1 or 2, and r is 3 or 4;

(ii) a radical polymerizable compound different from the above urethanated acryl compound; and (iii) a photopolymerization initiator, with the weight ratio of the urethanated acryl compound to the radical polymerizable compound being 80:20 to 10:90.

When a resin composition for forming a three-dimensional object by optical stereolithography, obtained by blending a liquid photo-curable resin comprising at least one member of the above urethanated acryl compound (I) and a radical polymerizable compound other than the urethanated acryl compound and a photopolymerization initiator with the above aluminum oxide fine particles and the whiskers in the above specific ratios, is used, a three-dimensional object by optical stereolithography having ultra-high heat resistance, high rigidity and excellent heat dimensional stability with a heat distortion temperature, measured under a load of 18.5 kg/mm$^2$, of 300° C. or higher, a flexural modulus of 2,000 kg/mm$^2$ or more and a linear thermal expansion coefficient of $3 \times 10^{-5}$ cm/cm/° C. or less can be obtained with high dimensional accuracy while retaining small volume shrinkage at the time of curing. Such a three-dimensional object by optical stereolithography having ultra-high heat resistance, high rigidity and excellent heat dimensional stability has been unknown and can be first obtained by the present invention.

In the above urethanated acryl compound (I) preferably used in the present invention, $R^1$ is a hydrogen atom or a methyl group, and p is 1 or 2. When p is 2, $R^1$ in either or both of the two groups $CH_2$=$C(R^1)$—COO— is a methyl group. In the case of urethanated acryl compound (I), when p is 2 and $R^1$ in both of the two groups $CH_2$=$C(R^1)$—COO— is a hydrogen atom, glycerin diacrylate that is extremely toxic, carcinogenic and stimulative to the skin is inevitably produced as an intermediate product. Therefore, such urethanated acryl compound (I) cannot be actually used, and hence, is not preferred.

In the urethanated acryl compound (I), the group A is a residual group of a diol or triol (i.e., a group which remains after the hydroxyl groups are removed from a diol or triol). The group A is the residual group of a diol or triol such as an aliphatic diol having 2 to 5 carbon atoms, alicyclic diol, aromatic diol, aliphatic triol, alicyclic triol or aromatic triol. Of these, the group A is preferably the residual group of a diol such as ethylene glycol, propylene glycol, butylene glycol, ethoxylated bisphenol A or spiroglycol, or the residual group of a triol such as glycerin, trimethylolpropane, 5-methyl-1,2,4-heptanetriol or 1,2,6-hexanetriol. The group A is more preferably a residual alcohol group of ethylene glycol or glycerin, much more preferably a residual alcohol group of glycerin.

In the urethanated acryl compound (I), the group D is a divalent or trivalent non-substituted or substituted hydrocarbon group. The group D is preferably a divalent or trivalent non-substituted or substituted aliphatic, aromatic or alicyclic hydrocarbon group having 6 to 20 carbon atoms. Preferred examples of the group D in the urethanated acryl compound (I) include isophorone group, tolylene group, 4,4'-diphenylmethane group, naphthylene group, xylylene group, phenylene group, 3,3'-dichloro-4,4'-phenylmethane group, toluylene group, hexamethylene group, 4,4'-dicyclohexylmethane group, hydrogenated xylylene group, hydrogenated diphenylmethane group, triphenylenemethane group, tetramethylxylene group and the like. Of these, the group D is more preferably isophorone group and/or tolylene group. In this case, the volume shrinkage at the time of curing and heat resistance of a three-dimensional object by optical stereolithography obtained from the liquid photo-curable resin composition of the present invention can be well-balanced with ease.

In the urethanated acryl compound (I), q is 1 when the group D is a divalent hydrocarbon group, and q is 2 when the group D is a trivalent hydrocarbon group.

In the urethanated acryl compound (I), the group E is a (poly)ethylene oxide group represented by the formula: —$(CH_2CH_2O)_s$— (in which s is an integer of 1 to 4), a (poly)propylene oxide group represented by the formula: —$[(CH_2CH(CH_3)O]_t$— (in which t is an integer of 1 to 4) or (poly)ethylene oxide propylene oxide group represented by the formula —(CH$_2$CH$_2$O)$_u$[(CH$_2$CH(CH$_3$)O]$_v$— (in which u and v are each an integer of 1 to 3 and the sum of u and v is 2 to 4). In the group E, that is, the (poly)ethylene oxide group or (poly)propylene oxide group represented by the above formula, s or t is preferably an integer of 1 to 3, more preferably 1 or 2.

In the (poly)ethylene oxide propylene oxide group represented by the above formula, the sum of u and v is preferably 2 or 3, more preferably 2. Particularly when the group E in the urethanated acryl compound (I) is a (poly) propylene oxide group represented by the formula: —[(CH$_2$CH(CH$_3$)O]$_t$— (t is preferably 1 to 3, more preferably 1 or 2), a photo-curable resin composition having more excellent heat resistance with a higher heat distortion temperature, smaller volume shrinkage at the time of curing and relatively low viscosity can be obtained advantageously.

In the urethanated acryl compound (I), the group R$^2$ is a hydrogen atom or an alkyl group, and r is 3 or 4. The group R$^2$ is preferably a lower-alkyl group having 1 to 4 carbon atoms, more preferably a methyl group or ethyl group.

Illustrative examples of the urethanated acryl compound (I), though not particularly limited, include:

(1) urethanated acryl compounds of the above formula (I) in which p is 1, R$^1$ is a hydrogen atom or a methyl group, q is 1, D is a divalent non-substituted or substituted aromatic, aliphatic or alicyclic hydrocarbon group, and r is 4, wherein four urethane acrylate groups represented by the formula CH$_2$=C(R$^1$)COO-A-OOC—NH-D-NH—COO-E-CH$_2$— are bonded to one carbon atom.

(2) urethanated acryl compounds of the above formula (I) in which p is 1, R$^1$ and R$^2$ are each a hydrogen atom or a methyl group, q is 1, D is a divalent non-substituted or substituted aromatic, aliphatic or alicyclic hydrocarbon group, and r is 3, wherein three urethane acrylate groups represented by the formula CH$_2$=C(R$^1$)COO-A-OOC—NH-D-NH—COO-E-CH$_2$— are bonded to one carbon atom (that is, the carbon atom to which the residual group R$^2$ is bonded).

(3) urethanated acryl compounds of the above formula (I) in which p is 2, one of the two R$^1$'s is a hydrogen atom and the other is a methyl group, q is 1, D is a divalent non-substituted or substituted aromatic, aliphatic or alicyclic hydrocarbon group, and r is 4, wherein four urethane acrylate groups represented by the formula [CH$_2$=C(R$^1$)COO]$_2$-A-OOC—NH-D-NH—COO-E-CH$_2$— are bonded to one carbon atom [in other words, urethanated acryl compounds (I) having 8 (meth)acrylate groups in one molecule].

(4) urethanated acryl compounds of the above formula (I) in which p is 2, one of the two R$^1$'s is a hydrogen atom and the other is a methyl group, R$^2$ is a hydrogen atom or a methyl group, q is 1, D is a divalent non-substituted or substituted aromatic, aliphatic or alicyclic hydrocarbon group, and r is 3, wherein three urethane acrylate groups represented by the formula [CH$_2$=C(R$^1$)COO]$_2$-A-OOC—NH-D-NH—COO-E-CH$_2$— are bonded to one carbon atom (that is, the carbon atom to which the residual group R$^2$ is bonded) [in other words, urethanated acryl compounds (I) having 6 (meth)acrylate groups in one molecule].

(5) urethanated acryl compounds of the above formula (I) in which p is 1, R$^1$ is a hydrogen atom or a methyl group, q is 2, D is a trivalent non-substituted or substituted aromatic, aliphatic or alicyclic hydrocarbon group, and r is 4, wherein four urethane acrylate groups represented by the formula [CH$_2$=C(R$^1$)COO-A-OOC—NH]$_2$-D-NH—COO-E-CH$_2$— are bonded to one carbon atom [in other words, urethanated acryl compounds (I) having 8 (meth)acrylate groups in one molecule].

(6) urethanated acryl compounds of the above formula (I) in which p is 1, R$^1$ and R$^2$ are each a hydrogen atom or a methyl group, q is 2, D is a trivalent non-substituted or substituted aromatic, aliphatic or alicyclic hydrocarbon group, and r is 3, wherein three urethane acrylate groups represented by the formula [CH$_2$=C(R$^1$)COO-A-OOC—NH]$_2$-D-NH—COO-E-CH$_2$— are bonded to one carbon atom [in other words, urethanated acryl compounds (I) having 6 (meth)acrylate groups in one molecule].

(7) urethanated acryl compounds of the above formula (I) in which p is 2, one of the two R$^1$'s is a hydrogen atom and the other is a methyl group, q is 2, D is a trivalent non-substituted or substituted aromatic, aliphatic or alicyclic hydrocarbon group, and r is 4, wherein four urethane acrylate groups represented by the formula {[CH$_2$=C(R$^1$)COO]$_2$-A-OOC—NH}$_2$-D-NH—COO-E-CH$_2$— are bonded to one carbon atom [in other words, urethanated acryl compounds (I) having 16 (meth)acrylate groups in one molecule].

(8) urethanated acryl compounds of the above formula (I) in which p is 2, one of the two R$^1$'s is a hydrogen atom and the other is a methyl group, R$^2$ is a hydrogen atom or a methyl group, q is 2, D is a trivalent non-substituted or substituted aromatic, aliphatic or alicyclic hydrocarbon group, and r is 3, wherein three urethane acrylate groups represented by the formula {[CH$_2$=C(R$^1$)COO]$_2$-A-OOC—NH}$_2$-D-NH—COO-E-CH$_2$— are bonded to one carbon atom [in other words, urethanated acryl compounds (I) having 12 (meth)acrylate groups in one molecule].

The method for producing an urethanated acryl compound (I) is not particularly limited, but the urethanated acryl compound (I) can be produced as follows, for example.

[Example of method for producing urethanated acryl compound (I)]

The method comprises the steps of:

(1) reacting a (meth)acrylate (II) represented by the following formula (II):

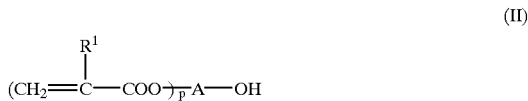

(II)

wherein R$^1$, A, a and p are the same groups and numbers as described above, respectively, with a polyisocyanate compound (III) represented by the following general formula (III):

(III)

wherein D and q are the same group and number as described above, respectively, in such a weight ratio that one isocyanate group in the polyisocyanate compound (III) should remain, in the presence or absence of a diluent comprising a radical polymerizable compound which does not show reactivity with the isocyanate group to form a reaction product comprising a monoisocyanate compound (IV) represented by the following formula (IV):

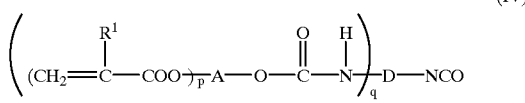

wherein $R^1$, A, D, p and q are the same groups and numbers as described above, respectively,
or a reaction product comprising the above monoisocyanate compound (IV) and the above radical polymerizable compound;
and (2) mixing the reaction product obtained in the above step (1) with a polyol compound (V) represented by the following general formula (V):

wherein $R^2$, E and r are the same groups and number as described above, respectively,
in such a ratio that the remaining isocyanate group in the monoisocyanate compound (IV) and the hydroxyl group in the polyol compound (V) react with each other in a ratio of 1:1 and allowing the mixture to react to produce a reaction product comprising an urethanated acryl compound (I) represented by the above formula (I) or a reaction product comprising the above urethanated acryl compound (I) and the above radical polymerizable compound.

Any radical polymerizable compounds are acceptable as the other radical polymerizable compound to be used thogether with the above urethanated acryl compound (I) as long as it has a carbon-carbon unsaturated bond which can form a cured product by reacting with the urethanated acryl compound (I) or with other radical polymerizable compound at the time of exposure to light. Of them, preferably used are acrylic compounds, allyl compounds and/or vinyl lactams. In this case, the radical polymerizable compound may be either a monofunctional compound or a polyfunctional compound, or a combination of these. Further, the radical polymerizable compound may be a low molecular weight monomer, oligomer or a compound having a relatively large molecular weight as the case may be. These other radical polymerizable compounds may be used alone or in combination of two or more.

Illustrative examples of the other radical polymerizable compound which can be used in combination with the urethanated acryl compound (I), though not particularly limited, include (meth)acrylates such as isobornyl (meth)acrylate, bornyl (meth)methacrylate, dicyclopentenyl (meth)acrylate, 2-hydroxyethyl (meth)acrylate, 2-hydroxypropyl (meth)acrylate, (poly)propylene glycol mono(meth)acrylate and t-butyl (meth)acrylate; (meth)acrylamides such as morpholine (meth)acrylamide; monofunctional radical polymerizable compounds such as N-vinylcaprolactone and styrene; and polyfunctional radical polymerizable compounds such as trimethylolpropane tri(meth)acrylate, ethylene oxide modified trimethylolpropane tri(meth)acrylate, ethylene glycol di(meth)acrylate, diethylene glycol (meth)acrylate, triethylene glycol (meth)acrylate, tetraethylene glycol di(meth)acrylate, polyethylene glycol (meth)acrylate, 1,4-butanediol di(meth)acrylate, 1,6-hexanediol di(meth)acrylate, neopentyl glycol di(meth)acrylate, dicyclopentenyl di(meth)acrylate, diallyl phthalate, diallyl fumarate and ethylene oxide-modified bisphenol A diacrylate.

Epoxy compounds, urethanated acryl compounds other than the urethanated acryl compounds (I), epoxy (meth) acrylate compounds and other ester (meth)acrylates, all of which have been hitherto used as a resin composition for forming a three-dimensional object by optical stereolithography, can be used as the other radical polymerizable compound, in addition to the above radical polymerizable compounds.

The above other radical polymerizable compounds may be used alone or in combination of two or more. The other radical polymerizable compound to be used in combination with the urethanated acryl compound (I) is preferably morpholine (meth)acrylamide, dicyclopentenyl di(meth)acrylate or N-vinylcaprolactam. In this case, a three-dimensional object by optical stereolithography having more excellent dimensional accuracy with smaller volume shrinkage and excellent heat resistance with a high heat distortion temperature can be obtained at the time of photo-curing.

In a liquid photo-curable resin used in the resin composition for forming a three-dimensional object by optical stereolithography of the present invention, any photopolymerization initiator which has been hitherto used in photocurable resin compositions is acceptable as the photopolymerization initiator for polymerizing a photopolymerizable compound. Illustrative examples of the photopolymerizable initiator usable in the present invention, though not particularly limited, include 2,2-dimethoxy-2-phenylacetophenone, 1-hydroxycyclohexylphenyl ketone, diethoxyacetophenone, acetophenone, 3-methylacetophenone, 2-hydroxymethyl-1-phenylpropan-1-one, 4'-isopropyl-2-hydroxy-2-propiophenone, 2-hydroxy-2-methyl-propiophenone, p-dimethylaminoacetophenone, p-t-butyldichloroacetophenone, p-t-butyltrichloroacetophenone, p-azidobenzalacetophenone, 1-hydroxycyclohexylphenyl ketone, benzophenone, methyl o-benzoylbenzoate, Michler's ketone, 4,4'-bisdiethylaminobenzophenone, xanthone, fluorenone, fluorene, benzaldehyde, anthraquinone, triphenylamine, carbazole and the like.

When the radical polymerizable compound in the liquid photo-curable resin is a compound having a cationical polymerizable group such as an epoxy group, a photo-cationic polymerization initiator may be used as the photo-polymerization initiator. The kind of the photo-cationic polymerization initiator is not particularly limited, and conventionally known photo-cationic polymerization initiators may be used.

The amount of the photopolymerization initiator is preferably 0.1 to 10 wt %, more preferably 1 to 5 wt %, based on the weight of the liquid photo-curable resin before the addition of a photopolymerization initiator, aluminum oxide fine powders and whiskers.

The resin composition for forming a three-dimensional object by optical stereolithography of the present invention may contain a leveling agent, surfactant, organic polymer modifier, organic plasticizer and the like as required, in addition to the above components.

The viscosity of the photo-curable resin composition of the present invention can be controlled according to application purpose or mode of use. In general, the viscosity, measured using a rotary B-type viscometer at normal temperature (25° C.), of the photo-curable resin composition is preferably around 5,000 to 100,000 centipoise (cp) from the viewpoint of handling properties, optical shapability and the dimensional accuracy of the obtained three-dimensional object by optical stereolithography and it is more preferably around 10,000 to 70,000 cp, much more preferably 20,000 to 60,000 cp.

The photo-curable resin composition of the present invention can be generally preserved for a long period of time of about 6 to 18 months at a temperature of 10 to 40° C. while maintaining excellent photo-curing properties and preventing its modification and polymerization when it is preserved in a state capable of shielding light.

The photo-curable resin composition of the present invention can be used for various applications by making use of its characteristic properties such as excellent dimensional accuracy with small volume shrinkage at the time of photo-curing, high heat resistance with a high heat distortion temperature, high rigidity with a high flexural modulus, and excellent heat dimensional stability with a small linear thermal expansion coefficient.

For practicing an optical stereolithography using the photo-curable resin composition of the present invention, any conventionally known optical stereolithography and apparatuses can be employed. Of these, activation energy beams generated from an Ar laser, He—Cd laser, xenon lamp, metal halide lamp, mercury lamp or fluorescent lamp are preferably used as light energy for curing the resin in the present invention, and laser beams are particularly preferably used. When a laser beam is used as an activation energy beam, the shaping time can be shortened by increasing energy level and a three-dimensional object having high shaping accuracy can be obtained by making use of the excellent convergence of laser beams.

As described above, for practicing the optical stereolithography using the photo-curable resin composition of the present invention, any conventionally known methods and optical shaping system devices can be employed and are not particularly limited. A typical example of optical stereolithography preferably used in the present invention is a method comprising the steps of forming a cured layer by selectively irradiating a liquid photo-curable resin composition containing a light energy absorber with an activation energy beam so as to form a cured layer having a desired pattern, then supplying an uncured liquid photo-curable resin composition onto the cured layer, irradiating it with the activation energy beam similarly to form a new cured layer which is continuously laminated onto the above cured layer, and repeating this lamination step to obtain the finally targeted three-dimensional object.

The thus-obtained three-dimensional object may be used directly or post-cured by light irradiation or by heat so as to further improve its mechanical properties or shape stability.

The structure, shape and size of the three-dimensional object are not particularly limited and can be determined according to application purpose. Typical application fields of the optical stereolithography of the present invention include the formation of models for checking the appearance of designs in the course of designing, models for checking the functionality of parts, base models for forming resin molds and metal molds for making casting molds, direct molds for prototype metal molds and the like. More specifically, the application fields include the formation of models and processing models for precision parts, electric and electronic parts, furniture, buildings, auto parts, various containers, casting, metal molds and matrices. Particularly, by making use of excellent characteristic properties such as excellent heat resistance, high rigidity and heat dimensional stability (low linear thermal expansion coefficient), it can be extremely effectively used for the trial production of high-temperature parts, for example, the production of parts for the design of a complex heating medium circuit and the analysis and planning of the behavior of a heating medium having a complex structure, the production of molds for precision parts which require high heat dimensional stability, and the like.

EXAMPLES

The present invention will be explained more in detail with reference to Examples hereinafter, while the present invention shall not be limited thereto.

In the following examples, the average particle diameter of aluminum oxide fine particles and the size and aspect ratio of whiskers were obtained as follows.

The tensile strength, tensile elongation, flexural strength, flexural modulus, heat distortion temperature and linear thermal expansion coefficient of a three-dimensional object by optical stereolithography obtained by optical stereolithography and the volume shrinkage factor at the time of forming a three-dimensional object by optical stereolithography were obtained as follows.

[Average particle diameter of aluminum oxide fine particles]

Aluminum oxide fine particles were scattered over the specimen table of an electron microscope so as to keep them as away from one another as possible, a thin gold deposited film was formed to a thickness of 200 to 300 Å on the surface of the aluminum oxide fine particles by a gold sputtering device, and the aluminum oxide fine particles were observed through a scanning electron microscope at a magnification of 10,000 to 30,000× to obtain the area circle equivalent diameters of at least 100 aluminum oxide fine particles using a particle size measuring instrument (Luzex 500 of Nippon Regulator Co., Ltd.) and average the measurement values.

[Size and aspect ratio of whiskers]

Using a laser diffraction/diffusion type particle size distribution measuring instrument (LA-7000 of Matoba Seisakusho Co., Ltd.) and ion exchange water as a dispersion medium, whiskers were dispersed in the ion exchange water in an amount of 1 wt % to examine the particle size distribution of the whiskers, and the particle size of the particles of 10% from the smallest one (D10) was taken as diameter (fiber diameter) and the particle size of the particles of 90% from the smallest one (D90) was taken as length (fiber length). The ratio of D90/D10 was obtained as an aspect ratio.

[Tensile strength and tensile elongation of three-dimensional object by optical stereolithography]

A dumbbell-shaped test piece prepared by optical stereolithography was used for the measurement of its tensile strength and tensile elongation in accordance with JIS K7113.

[Flexural strength of three-dimensional object by optical stereolithography]

A test piece in accordance with JIS K7207 was prepared by optical stereolithography and measured for its flexural strength in accordance with JIS K7207.

[Flexural modulus of three-dimensional object by optical stereolithography]

A test piece in accordance with JIS K7207 was prepared by optical stereolithography and measured for its flexural modulus in accordance with JIS K7207.

[Heat distortion temperature of three-dimensional object by optical stereolithography]

A dumbbell-shaped test piece prepared by optical stereolithography was used to measure its heat distortion temperature by the method A (load of 18.5 kg/mm$^2$) in accordance with JIS K7207.

[Linear thermal expansion coefficient of three-dimensional object by optical stereolithography]

A square pillar-shaped test piece (5 mm×5 mm×12 mm) in accordance with JIS K7197 was prepared by optical stereolithography and used to measure its linear thermal expansion coefficient in accordance with JIS K7197. The measurement values ranging from room temperature to 150° C. were averaged to obtain a linear thermal expansion coefficient.

[Volume shrinkage factor at the time of forming three-dimensional object by optical stereolithography]

The specific gravity ($d_1$) of a photo-curable resin composition before photo-curing which was used to form a three-dimensional object by optical stereolithography and the specific gravity ($d_2$) of a three-dimensional object (dumbbell-shaped test piece) obtained by optical stereolithography were measured to obtain the volume shrinkage factor (%) of the three-dimensional object by optical stereolithography from the following equation (2).

$$\text{volume shrinkage factor } (\%) = \{(d_2 - d_1)/d_2\} \times 100 \qquad (2)$$

Synthesis Example 1

[Production of reaction product containing urethanated acryl compound (I) and radical polymerizable compound]

(1) 8,880 Grams of isophorone diisocyanate, 9,060 g of morpholine acrylamide and 10.0 g of dibutyltin dilaurate were charged into a 50-liter three-necked flask equipped with a stirrer, temperature controller, thermometer and condenser, and the flask was heated in an oil bath to have inside temperature of 80 to 90° C.

(2) A solution obtained by uniformly dissolving 7.0 g of methyl hydroquinone in 8,560 g of glycerine monomethacrylate monoacrylate was charged into a dropping funnel equipped with a bypass, which was heated to 50° C. in advance. The solution in the dropping funnel was added dropwise to the contents of the flask (1) under stirring while the temperature of the contents of the flask was kept at 80 to 90° C. in a nitrogen atmosphere. The contents of the flask were further stirred at the same temperature for 2 hours to carry out a reaction.

(3) Then, after the temperature of the contents of the flask was reduced to 60° C., 3,660 g of an addition product of pentaerythritol with four moles of propylene oxide (that is, one mole of propylene oxide was added to each of four hydroxyl groups of pentaerythritol) charged in another dropping funnel was quickly added dropwise to the flask, the temperature of the contents of the flask was maintained at 80 to 90° C. to carry out a reaction for four hours to form a reaction product containing an urethanated acryl compound (I) and a radical polymerizable compound (morpholine acrylamide), and the obtained reaction product was taken out of the flask before cooled.

(4) The obtained reaction product was a viscous achromatic liquid at normal temperature (25° C.). The urethanated acryl compound (I) contained in the reaction product obtained in this Synthesis Example 1 was an urethanated acryl compound of the above formula (1) in which p=2, two $R^1$'s=a hydrogen atom and a methyl group, A=a residual glycerine group, q=1, D=an isophorone group, E=a propylene oxide group (t=1) and r=4.

Example 1

(1) 2,020 Grams of the reaction product containing the urethanated acryl compound (I) and the radical polymerizable compound obtained in Synthesis Example 1, 454 g of morpholine acrylamide and 1,060 g of dicyclopentenyl diacrylate were charged into a 5-liter three-necked flask equipped with a stirrer, cooling pipe and dropping funnel having a bypass, and the inside of the flask was depressurized, deaerated and substituted with nitrogen.

Thereafter, in an ultravioletlight-screened environment, 118 g of 1-hydroxycyclohexylphenyl ketone (Irgacure 184 of Chiba Geigy Co., Ltd.; photo-radical polymerization initiator) was added to the flask, and the mixture was mixed under stirring at 25° C. until it was completely dissolved (mixing-under-stirring time of about 1 hour). The thus-obtained photo-curable resin which was an achromatic transparent viscous liquid (viscosity of about 2,100 cp at normal temperature).

(2) 3,652 Grams of the photo-curable resin obtained in (1) above was charged into a universal stirrer (manufactured by Dalton Co., Ltd.; inner volume of 10 liters), and 38 g of a leveling agent (Superdine V201 of Takemoto Yushi Co., Ltd.), 5,219 g (24.3 vol % based on the total volume of the finally obtained resin composition for forming a three-dimensional object by optical stereolithography) of aluminum oxide fine particles [average particle diameter=15 μm, relative standard deviation value of sphericity based on the above expression (1)=0.3 (Admafine A-509 of Admatex Co., Ltd.)] treated with an acrylsilane coupling agent [manufactured by Toshiba Silicone Co., Ltd.; γ(methacryloxypropyl)trimethoxysilane] and 2,409 g (14.6 vol % based on the total volume of the finally obtained resin composition) of aluminum borate whiskers (Alborex YS-4 of Shikoku Kasei Kogyo Co., Ltd.; diameter of 0.5 to 0.7 μm, aspect ratio of 50 to 70) treated with the same acrylsilane coupling agent as above were added, stirred for one day and defoamed to obtain a liquid photo-curable resin composition containing aluminum oxide fine particles and whiskers (viscosity of about 48,000 cp at 25° C.).

(3) A three-dimensional object by optical stereolithography of dumbbell-shaped test piece for measuring tensile strength, tensile elongation, flexural strength, flexural modulus and heat distortion temperature was prepared by irradiating the resin composition for forming a three-dimensional object by optical stereolithography obtained in (2) above with water-cooled Ar laser light (output of 500 mW; wavelength of 333, 351 and 364 nm) using an ultra high-speed optical shaping system (SOLIFORM 500 of Teijin Seiki Co., Ltd.) from the direction perpendicular to the surface thereof and by carrying out optical stereolithography under conditions of an irradiation energy of 20 to 30 mJ/cm$^2$, a slice pitch (laminate thickness) of 0.05 mm and an average shaping time of 2 minutes per layer. The obtained three-dimensional object by optical stereolithography was washed with isopropyl alcohol and exposed to 3 KW of ultraviolet light for 10 minutes to be post-cured. The tensile strength, tensile elongation, flexural strength, flexural modulus and heat distortion temperature of the thus obtained three-dimensional object by optical stereolithography (dumbbell-shaped test piece) were measured in accordance with the above methods and found to be as shown in Table 1 below.

Further, the specific gravity ($d_1$) of the resin composition for forming a three-dimensional object by optical stereolithography before photo-curing which was used in the formation of the three-dimensional object by optical stereolithography of Example 1 and the specific gravity ($d_2$) of the three-dimensional object by optical stereolithography after post-curing were measured to obtain the volume shrinkage factor (%) from the above expression (2). The result is shown in Table 1 below.

Example 2

(1) A photo-curable resin which was an achromatic transparent viscous liquid (viscosity of about 2,100 cp at normal temperature) was prepared in the same manner as in (1) of Example 1.

(2) 3,652 Grams of the photo-curable resin obtained in (1) above was charged into a universal stirrer (manufactured by Dalton Co., Ltd.; inner volume of 10 liters), and 26 g of the same leveling agent as used in (2) of Example 1, 3,772 g (23.3 vol % based on the total volume of the finally obtained resin composition for forming a three-dimensional object by optical stereolithography) of aluminum oxide fine particles (Admafine A-509 of Admatex Co., Ltd.) treated with the same acrylsilane coupling agent as used in (2) of Example 1 and 1,593 g (12.8 vol % based on the total volume of the finally obtained resin composition for forming a three-dimensional object by optical stereolithography) of aluminum borate whiskers (Alborex YS-4) treated with the same acrylsilane coupling agent as used in (2) of Example 1 were also added to the universal stirrer, stirred for one day and defoamed to obtain a liquid photo-curable resin composition containing aluminum oxide fine particles and whiskers (viscosity of about 30,500 cp at 25° C.).

(3) Using the resin composition for forming a three-dimensional object by optical stereolithography obtained in (2) above, a three-dimensional object by optical stereolithography of dumbbell-shaped test piece was prepared by optical stereolithography in the same manner as in (3) of Example 1 and measured for its tensile strength, tensile elongation, flexural strength, flexural modulus and heat distortion temperature in accordance with the above methods. The measurement results are shown in Table 1.

Further, the specific gravity ($d_1$) of the resin composition for forming a three-dimensional object by optical stereolithography before photo-curing which was used in the formation of the three-dimensional object by optical stereolithography of Example 2 and the specific gravity ($d_2$) of the three-dimensional object by optical stereolithography after post-curing were measured to obtain the volume shrinkage factor (%) from the above expression (2). The result is shown in Table 1 below.

Example 3

(1) A photo-curable resin which was an achromatic transparent viscous liquid (viscosity of about 2,100 cp at normal temperature) was prepared in the same manner as in (1) of Example 1.

(2) 3,652 Grams of the photo-curable resin obtained in (1) above was charged into a universal stirrer (manufactured by Dalton Co., Ltd.; inner volume of 10 liters), and 42 g of the same leveling agent as used in (2) of Example 1, 5,529 g (26.6 vol % based on the total volume of the finally obtained resin composition for forming a three-dimensional object by optical stereolithography) of aluminum oxide fine particles (Admafine A-509 of Admatex Co., Ltd.) treated with the same acrylsilane coupling agent as used in (2) of Example 1 and 2,926 g (18.3 vol % based on the total volume of the finally obtained resin composition for forming a three-dimensional object by optical stereolithography) of aluminum borate whiskers (Alborex YS-4) treated with the same acrylsilane coupling agent as used in (2) of Example 1 were also added to the universal stirrer, stirred for one day and defoamed to obtain a liquid photo-curable resin composition containing aluminum oxide fine particles and whiskers (viscosity of about 63,000 cp at 25° C.).

(3) Using the resin composition for forming a three-dimensional object by optical stereolithography obtained in (2) above, a three-dimensional object by optical stereolithography of dumbbell-shaped test piece was formed by optical stereolithography in the same manner as in (3) of Example 1 and measured for its tensile strength, tensile elongation, flexural strength, flexural modulus and heat distortion temperature in accordance with the above methods. The measurement results are shown in Table 1 below.

Further, the specific gravity ($d_1$) of the resin composition for forming a three-dimensional object by optical stereolithography before photo-curing which was used in the formation of the three-dimensional object by optical stereolithography of Example 3 and the specific gravity ($d_2$) of the three-dimensional object by optical stereolithography after post-curing were measured to obtain the volume shrinkage factor (%) from the above expression (2). The result is shown in Table 1 below.

(4) A square pillar-shaped test piece for measuring a linear thermal expansion coefficient was prepared using the resin composition for forming a three-dimensional object by optical stereolithography obtained in (2) above in accordance with the above method and measured for its linear thermal expansion coefficient in accordance with the above method. It was found to be extremely low, $1.25 \times 10^{-5}$ cm/cm/° C., and the resin composition was therefore excellent in heat dimensional stability.

Example 4

(1) A photo-curable resin which was an achromatic transparent viscous liquid (viscosity of about 2,100 cp at normal temperature) was prepared in the same manner as in (1) of Example 1.

(2) 3,652 Grams of the photo-curable resin obtained in (1) above was charged into a universal stirrer (manufactured by Dalton Co., Ltd.; inner volume of 10 liters), and 38 g of the same leveling agent as used in (2) of Example 1, 5,219 g (24.3 vol % based on the total volume of the finally obtained resin composition for forming a three-dimensional object by optical stereolithography) of aluminum oxide fine particles (NR325F-ST of Nippon Light Metal Co., Ltd.) treated with the same acrylsilane coupling agent as used in (2) of Example 1 and 2,409 g (14.6 vol % based on the total volume of the finally obtained resin composition for forming a three-dimensional object by optical stereolithography) of aluminum borate whiskers (Alborex YS-4) treated with the same acrylsilane coupling agent as used in (2) of Example 1 were also added to the universal stirrer, stirred for one day and defoamed to obtain a liquid photo-curable resin composition containing aluminum oxide fine particles and whiskers (viscosity of about 47,000 cp at 25° C).

(3) Using the resin composition for forming a three-dimensional object by optical stereolithography obtained in (2) above, a three-dimensional object by optical stereolithography of dumbbell-shaped test piece was prepared by optical stereolithography in the same manner as in (3) of Example 1 and measured for its tensile strength, tensile elongation, flexural strength, flexural modulus and heat distortion temperature in accordance with the above methods. The measurement results are shown in Table 1 below.

Further, the specific gravity ($d_1$) of the resin composition for forming a three-dimensional object by optical stereolithography before photo-curing which was used in the formation of the three-dimensional object by optical stereolithography of Example 4 and the specific gravity ($d_2$) of the three-dimensional object by optical stereolithography after post-curing were measured to obtain the volume shrinkage factor (%) from the above expression (2). The result is shown in Table 1 below.

(4) A square pillar-shaped test piece for measuring a linear thermal expansion coefficient was prepared using the resin composition for forming a three-dimensional object by optical stereolithography obtained in (2) above in accordance with the above method and measured for its linear thermal expansion coefficient in accordance with the above method. It was found to be extremely low, $1.05 \times 10^{-5}$ cm/cm/° C., and the resin composition was therefore excellent in heat dimensional stability.

Example 5

(1) A photo-curable resin which was an achromatic transparent viscous liquid (viscosity of about 2,100 cp at normal temperature) was prepared in the same manner as in (1) of Example 1.

(2) 3,652 Grams of the photo-curable resin obtained in (1) above was charged into a universal stirrer (manufactured by Dalton Co., Ltd.; inner volume of 10 liters), and 38 g of the same leveling agent as used in (2) of Example 1, 2,765 g (13.3 vol % based on the total volume of the finally obtained resin composition for forming a three-dimensional object by optical stereolithography) of aluminum oxide fine particles (Admafine A509 of Admatex Co., Ltd.) treated with the same acrylsilane coupling agent as used in (2) of Example 1, 2,610 g (12.2 vol % based on the total volume of the finally obtained resin composition for forming a three-dimensional object by optical stereolithography) of aluminum oxide fine particles (NR325F-ST of Nippon Light Metal Co., Ltd.) treated with the same acrylsilane coupling agent as used in (2) of Example 4, and 2,668 g (16.5 vol % based on the total volume of the finally obtained resin composition for forming a three-dimensional object by optical stereolithography) of aluminum borate whiskers (Alborex YS-4) treated with the same acrylsilane coupling agent as used in (2) of Example 1 were also added to the universal stirrer, stirred for one day and defoamed to obtain a liquid photo-curable resin composition containing aluminum oxide fine particles and whiskers (viscosity of about 56,000 cp at 25° C.).

(3) Using the resin composition for forming a three-dimensional object by optical stereolithography obtained in (2) above, a three-dimensional object by optical stereolithography of dumbbell-shaped test piece was prepared by optical stereolithography in the same manner as in (3) of Example 1 and measured for its tensile strength, tensile elongation, flexural strength, flexural modulus and heat distortion temperature in accordance with the above methods. The measurement results are shown in Table 1 below.

Further, the specific gravity ($d_1$) of the resin composition for forming a three-dimensional object by optical stereolithography before photo-curing which was used in the formation of the three-dimensional object by optical stereolithography of Example 5 and the specific gravity ($d_2$) of the three-dimensional object by optical stereolithography after post-curing were measured to obtain the volume shrinkage factor (%) from the above expression (2). The result is shown in Table 1 below.

(4) A square pillar-shaped test piece for measuring a linear thermal expansion coefficient was prepared using the resin composition for forming a three-dimensional object by optical stereolithography obtained in (2) above in accordance with the above method and measured for its linear thermal expansion coefficient in accordance with the above method. It was found to be extremely low, $1.20 \times 10^{-5}$ cm/cm/° C., and the resin composition was therefore excellent in heat dimensional stability.

Reference Example 1

(1) A photo-curable resin which was an achromatic transparent viscous liquid (viscosity of about 2,100 cp at normal temperature) was prepared in the same manner as in (1) of Example 1.

(2) Using the photo-curable resin obtained in (1) above, a three-dimensional object by optical stereolithography of dumbbell-shaped test piece was prepared by optical stereolithography in the same manner as in (3) of Example 1 and measured for its tensile strength, tensile elongation, flexural strength, flexural modulus and heat distortion temperature in accordance with the above methods. The measurement results are shown in Table 1 below.

Further, the specific gravity ($d^1$) of the resin composition for forming a three-dimensional object by optical stereolithography before photo-curing which was used in the formation of the three-dimensional object by optical stereolithography in this Reference Example 1 and the specific gravity ($d^2$) of the three-dimensional object by optical stereolithography after post-curing were measured to obtain the volume shrinkage factor (%) from the above expression (2). The result is shown in Table 1 below.

Reference Example 2

(1) A photo-curable resin which was an achromatic transparent viscous liquid (viscosity of about 2,100 cp at normal temperature) was prepared in the same manner as in (1) of Example 1.

(2) 2,800 Grams of the photo-curable resin obtained in (1) above was charged Into a universal stirrer (manufactured by Dalton Co., Ltd.; inner volume of 10 liters), and 21.5 g of the same leveling agent as used in (2) of Example 1, 3,310 g (32 vol % based on the total volume of the finally obtained resin composition for forming a three-dimensional object by optical stereolithography) of glass beads (GB210C of Toshiba Ballotini Co., Ltd.) [average particle diameter of 15 $\mu$m, relative standard deviation value of sphericity based on the above expression (1) of 0.3] treated with the same acrylsilane coupling agent as used in (2) of Example 1, and 993 g (8 vol % based on the total volume of the finally obtained resin composition for forming a three-dimensional object by optical stereolithography) of aluminum borate whiskers (Alborex YS-4) treated with the same acrylsilane coupling agent as used in (2) of Example 1 were also added to the universal stirrer, stirred for one day and defoamed to obtain a liquid photo-curable resin composition containing glass beads and whiskers (viscosity of about 49,000 cp at 25° C.).

(3) Using the resin composition for forming a three-dimensional object by optical stereolithography obtained in (2) above, a three-dimensional object by optical stereolithography of dumbbell-shaped test piece was prepared by optical stereolithography in the same manner as in (3) of Example 1 and measured for its tensile strength, tensile elongation, flexural strength, flexural modulus and heat distortion temperature in accordance with the above methods. The measurement results are shown in Table 1 below.

Further, the specific gravity ($d_1$) of the resin composition for forming a three-dimensional object by optical stereolithography before photo-curing which was used in the formation of the three-dimensional object by optical stereolithography in this Example 5 and the specific gravity ($d_2$) of the three-dimensional object by optical stereolithography after post-curing were measured to obtain the volume shrinkage factor (%) from the above expression (2). The result is shown in Table 1 below.

(4) A square pillar-shaped test piece for measuring a linear thermal expansion coefficient was prepared using the resin composition for forming a three-dimensional object by optical stereolithography obtained in (2) above in accordance with the above method and measured for its linear thermal expansion coefficient in accordance with the above method. It was found to be $4.8 \times 10^{-5}$ cm/cm/° C.

conventional three-dimensional object by optical stereolithography, which is 100° C. or lower, it can be said

TABLE 1

Physical properties of three-dimensional object formed by optical stereolithography

| Example | Filler | Tensile strength (kg/mm$^2$) | Tensile elongation (%) | Flexural strength (kg/mm$^2$) | Flexural modulus (kg/mm$^2$) | Heat distortion temperature (° C.) | Volume shrinkage factor[1] (%) | Linear thermal expansion coefficient × $10^{-5}$ (cm/cm/° C.) |
|---|---|---|---|---|---|---|---|---|
| Ex. 1 | Aluminum oxide fine particles + whiskers | 8.3 | 1.3 | 13.8 | 2283 | >300 | 1.8 | — |
| Ex. 2 | Aluminum oxide fine particles + whiskers | 7.5 | 1.5 | 12.8 | 2024 | >300 | 1.8 | — |
| Ex. 3 | Aluminum oxide fine particles + whiskers | 11.8 | 1.6 | 20.0 | 2600 | >300 | 1.8 | 1.25 |
| Ex. 4 | Aluminum oxide fine particles + whiskers | 10.1 | 1.3 | 16.3 | 2930 | >300 | 1.8 | 1.05 |
| Ex. 5 | Aluminum oxide fine particles + whiskers | 12.3 | 1.7 | 17.3 | 2710 | >300 | 1.8 | 1.20 |
| Ref. Ex. 1 | Not used | 6.1 | 1.4 | 11.4 | 391 | 127 | 6.4 | — |
| Ref. Ex. 2 | Glass beads + whiskers | 6.3 | 1.0 | 12.0 | 1590 | 251 | 1.8 | 4.80 |

[1]Volume shrinkage factor at the time of photo-curing

It is understood from the results of Table 1 above that a three-dimensional object by optical stereolithography having ultra high heat resistance with a heat distortion temperature, measured under a load of 18.5 kg/mm$^2$, of 300° C. or higher and high rigidity with a flexural modulus of more than 2,000 kg/mm$^2$ can be obtained in Examples 1 to 5 in which an optical stereolithography was carrying out using a resin composition for forming a three-dimensional object by optical stereolithography that contains 5 to 65 vol % of aluminum oxide fine particles having an average particle diameter of 3 to 70 μm and 5 to 30 vol % of whiskers having a diameter of 0.3 to 1 μm, a length of 10 to 70 μm and an aspect ratio of 10 to 100, especially in Examples 1 to 5 in which a liquid photo-curable resin containing the above urethanated acryl compound (I) was used as the liquid photo-curable resin in the resin composition for forming a three-dimensional object by optical stereolithography.

More specifically, in Reference Example 1 in which an optical stereolithography was carried out using a resin composition containing the urethanated acryl compound (I) developed by the present inventors as the liquid photo-curable resin in the resin composition for forming a three-dimensional object by optical stereolithography, other photopolymerizable compound and a photopolymerizable initiator, and in Reference Example 2 in which an optical stereolithography was carried out using a resin composition for forming a three-dimensional object by optical stereolithography obtained by having the resin composition of Reference Example 1 contain glass beads and whiskers, the heat distortion temperatures of three-dimensional objects obtained in these examples were 127° C. and 251° C., respectively. When the heat distortion temperatures of the three-dimensional objects by optical stereolithography obtained in Reference Example 1 and Reference Example 2 are compared with the heat distortion temperature of a that the formers are much higher than the latter. It is understood from the results of Table 1 above that three-dimensional objects by optical stereolithography obtained in Examples 1 to 5 of the present invention have a higher deformation temperature than those of Reference Example 1 and Reference Example 2 and an extremely high flexural modulus.

In addition, as is clear from the results of Examples 3 to 5, when the resin composition for forming a three-dimensional object by optical stereolithography of the present invention is used, a three-dimensional object by optical stereolithography having excellent heat dimensional stability with an extremely small linear thermal expansion coefficient can be obtained.

A three-dimensional object by optical stereolithography having high heat resistance with an extremely high heat distortion temperature and high rigidity with an extremely high flexural modulus, both properties of which could not be attained by the prior art, can be obtained smoothly from the resin composition for forming a three-dimensional object by optical stereolithography of the present invention by optical stereolithography.

Further, when the resin composition for forming a three-dimensional object by optical stereolithography of the present invention is used, a three-dimensional object by optical stereolithography having extremely excellent dimensional stability with a linear thermal expansion coefficient of $3 \times 10^{-5}$ cm/cm/° C. or less can be obtained smoothly by optical stereolithography even when temperature varies.

Furthermore, a three-dimensional object obtained in the present invention is excellent in other mechanical properties such as tensile strength, tensile elongation and flexural strength.

Particularly, when a liquid photo-curable resin comprising the above urethanated acryl compound (I), other photopolymerizable compound and a photopolymerization initiator is used as the liquid photo-curable resin used in the resin composition for forming a three-dimensional object by optical stereolithography of the present invention, a three-dimensional object by optical stereolithography having ultra-high heat resistance with a heat distortion temperature, measured under a load of 18.5 kg/mm², of 300° C. or higher, high rigidity with a flexural modulus of 2,000 kg/mm² or more, and a linear thermal expansion coefficient of $3 \times 10^{-5}$ cm/cm/° C. or less, all properties of which could not be attained by the three-dimensional object by optical stereolithography of the prior art, can be obtained with high dimensional accuracy while retaining low volume shrinkage at the time of photo-curing.

What is claimed is:

1. A resin composition for forming a three-dimensional object by optical stereo-lithography, which contains, in a photo-curable resin, 5 to 65 vol % of aluminum oxide fine particles having an average particle diameter of 3 to 70 μm and 5 to 30 vol % of aluminum-based whiskers selected from the group consisting of aluminum borate whiskers, aluminum oxide whiskers and aluminum nitride whiskers and having a diameter of 0.3 to 1 μm, a length of 10 to 70 μm and an aspect ratio of 10 to 100 based on the total volume of the resin composition, with the total content of the aluminum oxide fine particles and the aluminum-based whiskers being 10 to 70 vol % based on the total volume of the resin composition said particles and said whiskers having been surface-treated with a silane coupling agent.

2. The resin composition as in claim 1, which contains 15 to 55 vol % of the aluminum oxide fine particles and 5 to 20 vol % of the aluminum-based whiskers based on the total volume of the resin composition, the total content of the aluminum oxide fine particles and the aluminum-based whiskers being 20 to 60 vol % based on the total volume of the resin composition.

3. The resin composition as in claim 2, which contains 20 to 50 vol % of the aluminum oxide fine particles and 10 to 20 vol % of the aluminum-based whiskers based on the total volume of the resin composition, the total content of the aluminum oxide fine particles and the aluminum-based whiskers being 30 to 60 vol % based on the total volume of the resin composition.

4. The resin composition as in claim 1, which contains 20 to 50 vol % of the aluminum oxide fine particles and 10 to 20 vol % of the aluminum-based whiskers based on the total volume of the resin composition, the total content of the aluminum oxide fine particles and the aluminum-based whiskers being 30 to 60 vol % based on the total volume of the resin composition.

5. The resin composition as in claim 1, wherein the aluminum oxide fine particles have a relative standard deviation of sphericity represented by the following expression (1) of 5 or less:

$$\text{relative standard deviation of sphericity} = \sqrt{\left(\sum_i^n \frac{(D_i - D)^2}{n}\right)} / D \quad (1)$$

wherein
Di: area circle equivalent diameter of each particle (μm)
D: average value of area circle equivalent diameters $$\left(\sum_i^n D_i/n\right)(\mu m)$$

n: number of particles.

6. The resin composition as in claim 1, wherein the liquid photo-curable resin contains a photopolymerizable compound and a photopolymerization initiator.

7. The resin composition as in claim 1, wherein the liquid photo-curable resin comprises:
(i) at least one urethanated acryl compound represented by the following formula (I):

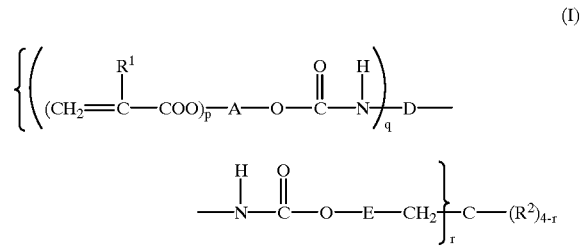

wherein R¹ is a hydrogen atom or a methyl group, p is 1 or 2 provided that either or both of R¹'s is/are a methyl group when p is 2, A is a residual group of a diol or triol, D is a divalent or trivalent non-substituted or substituted hydrocarbon group, E is a (poly)ethylene oxide group represented by the formula: —(CH₂CH₂O)ₛ— (in which s is an integer of 1 to 4), a (poly)propylene oxide group represented by the formula —[CH₂CH(CH₃)O]ₜ— (in which t is an integer of 1 to 4) or a (poly)ethylene oxide propylene oxide group represented by the formula —(CH₂CH₂O)ᵤ [CH₂CH(CH₃)O]ᵥ— (in which u and v are each an integer of 1 to 3 and the sum of u and v is 2 to 4), R² is a hydrogen atom or an alkyl group, q is 1 or 2, and r is 3 or 4;
(ii) a radical polymerizable compound different from he above urethanated acryl compound; and
(iii) a photopolymerization initiator, with the weight ratio of the urethanated acryl compound to the radical polymerizable compound being 80:20 to 10:90.

* * * * *